(12) United States Patent
Bergbauer et al.

(10) Patent No.: US 9,660,137 B2
(45) Date of Patent: May 23, 2017

(54) METHOD FOR PRODUCING A NITRIDE COMPOUND SEMICONDUCTOR DEVICE

(71) Applicant: OSRAM Opto Semiconductors GmbH, Regensburg (DE)

(72) Inventors: Werner Bergbauer, Windberg (DE);
Philipp Drechsel, Regensburg (DE);
Peter Stauss, Regensburg (DE);
Patrick Rode, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/891,924

(22) PCT Filed: May 28, 2014

(86) PCT No.: PCT/EP2014/061139
§ 371 (c)(1),
(2) Date: Nov. 17, 2015

(87) PCT Pub. No.: WO2014/198550
PCT Pub. Date: Dec. 18, 2014

(65) Prior Publication Data
US 2016/0093765 A1    Mar. 31, 2016

(30) Foreign Application Priority Data

Jun. 11, 2013 (DE) .................. 10 2013 106 044

(51) Int. Cl.
*H01L 33/00* (2010.01)
*H01L 21/02* (2006.01)
(Continued)

(52) U.S. Cl.
CPC ...... *H01L 33/0075* (2013.01); *H01L 21/0251* (2013.01); *H01L 21/0254* (2013.01);
(Continued)

(58) Field of Classification Search
CPC ..................................................... H01L 33/32
(Continued)

(56) References Cited

U.S. PATENT DOCUMENTS 7,655,962 B2 *   2/2010   Simin .................. H01L 29/402
                                                      257/192
7,859,109 B2 * 12/2010   Lee .................... H01L 21/28575
                                                      438/653
(Continued)

FOREIGN PATENT DOCUMENTS

CN          102460710 A     5/2012
CN          103069583 A     4/2013
(Continued)

OTHER PUBLICATIONS

Dadgar, A., et al., "Metalorganic chemical vapor phase epitaxy of gallium-nitride on silicon," Physica Status Solidi (c), vol. 0, Issue 6, Aug. 12, 2003, pp. 1583-1606.

*Primary Examiner* — Scott B Geyer
*Assistant Examiner* — S. M. S Imtiaz
(74) *Attorney, Agent, or Firm* — Slater Matsil, LLP

(57) ABSTRACT

A method is provided for producing a nitride compound semiconductor device. A growth substrate has a silicon surface. A buffer layer, which comprises $Al_xIn_yGa_{1-x-y}N$ with $0 \le x \le 1$, $0 \le y \le 1$ and $x+y \le 1$, is grown onto the silicon surface of the substrate. A semiconductor layer sequence is grown onto the buffer layer. The buffer layer includes a material composition that varies in such a way that a lateral lattice constant of the buffer layer increases stepwise or continuously in a first region and decreases stepwise or continuously in a second region, which follows the first region in the growth direction. At an interface with the semiconductor layer sequence, the buffer layer includes a smaller lateral (Continued)

lattice constant than a semiconductor layer of the semiconductor layer sequence adjoining the buffer layer.

16 Claims, 2 Drawing Sheets

(51) Int. Cl.
  *H01L 33/12* (2010.01)
  *H01L 33/06* (2010.01)
  *H01L 33/02* (2010.01)

(52) U.S. Cl.
  CPC .. *H01L 21/02381* (2013.01); *H01L 21/02433* (2013.01); *H01L 21/02458* (2013.01); *H01L 33/007* (2013.01); *H01L 33/0066* (2013.01); *H01L 33/0079* (2013.01); *H01L 33/06* (2013.01); *H01L 33/12* (2013.01); *H01L 33/025* (2013.01)

(58) Field of Classification Search
  USPC .......................................................... 438/47
  See application file for complete search history.

(56) References Cited

U.S. PATENT DOCUMENTS

| | | | |
|---|---|---|---|
| 7,994,539 B2 * | 8/2011 | Nam | H01L 21/0242 257/190 |
| 8,742,459 B2 | 6/2014 | Mishra et al. | |
| 8,785,943 B2 | 7/2014 | Shioda et al. | |
| 8,828,768 B2 | 9/2014 | Stauβ et al. | |
| 2003/0218181 A1 * | 11/2003 | Bader | B82Y 20/00 438/22 |
| 2008/0203430 A1 | 8/2008 | Simin et al. | |
| 2010/0187496 A1 | 7/2010 | Yan | |
| 2010/0289067 A1 * | 11/2010 | Mishra | H01L 29/2003 257/268 |
| 2011/0001127 A1 * | 1/2011 | Sakamoto | H01L 21/02381 438/478 |
| 2011/0266522 A1 * | 11/2011 | Kim | H01L 21/02378 257/E29.072 |
| 2012/0119219 A1 * | 5/2012 | Takado | H01L 29/41758 257/E29.089 |
| 2013/0001645 A1 * | 1/2013 | Kakuta | H01L 21/02392 257/190 |
| 2013/0062612 A1 | 3/2013 | Shioda et al. | |
| 2013/0140525 A1 * | 6/2013 | Chen | H01L 21/02381 257/E21.09 |
| 2013/0181255 A1 * | 7/2013 | Kiyama | H01L 29/66462 257/190 |
| 2013/0214285 A1 * | 8/2013 | Stauss | H01L 33/007 257/76 |
| 2014/0302665 A1 * | 10/2014 | Stauss | H01L 21/02381 438/478 |

FOREIGN PATENT DOCUMENTS

| | | |
|---|---|---|
| DE | 102006008929 A1 | 8/2007 |
| DE | 112007000060 T5 | 8/2008 |
| DE | 102009047881 A1 | 4/2011 |
| JP | 2004179452 A | 6/2004 |
| JP | 2012084662 A | 4/2012 |
| JP | 2013070065 A | 4/2013 |
| WO | 2011039181 A1 | 4/2011 |
| WO | 2012025397 A1 | 3/2012 |
| WO | 2013019302 A2 | 2/2013 |
| WO | 2013045355 A1 | 4/2013 |

* cited by examiner

METHOD FOR PRODUCING A NITRIDE COMPOUND SEMICONDUCTOR DEVICE

This patent application is a national phase filing under section 371 of PCT/EP2014/061139, filed May 28, 2014, which claims the priority of German patent application 10 2013 106 044.7, filed Jun. 11, 2013, each of which is incorporated herein by reference in its entirety.

TECHNICAL FIELD

The invention relates to a method for producing a nitride compound semiconductor device on a substrate with a silicon surface.

BACKGROUND

Nitride compound semiconductors are often used in LEDs or laser diodes, which generally emit in the blue spectral range. Depending on the composition of the semiconductor material, emission in the ultraviolet or green spectral range is, for example, also possible. The shortwave radiation may be converted to longer wavelengths through luminescence conversion using luminescent materials. This makes it possible to produce polychromatic light, in particular white light. LEDs based on nitride compound semiconductors are therefore of considerable significance for LED illumination systems.

When producing optoelectronic devices, the nitride compound semiconductor layers are generally grown epitaxially onto a growth substrate which is conformed to the lattice constant and the crystal structure of the nitride compound semiconductor material. Suitable substrate materials are in particular sapphire, GaN or SiC. These substrate materials are comparatively expensive, however.

The growth of nitride compound semiconductors on comparatively inexpensive silicon substrates is complicated by a comparatively large difference in the coefficients of thermal expansion of the silicon and the nitride compound semiconductor material. In particular, cooling of the layer system from the growth temperature of around 1000° C. used to grow nitride compound semiconductors to room temperature creates major tensile strains in the GaN.

German Patent document DE 10 2006 008 929 A1 and International Patent Publication WO 2011/039181 A1, also published as counterpart U.S. Pat. No. 8,828,768 B2, each describe methods for producing nitride compound semiconductor devices on silicon substrates. It is known from these documents to incorporate between the silicon surface of the growth substrate and the functional layer sequence of the optoelectronic device a layer structure for producing a compressive strain, which counteracts the tensile strain produced by the silicon during cooling.

International Patent Publication WO 2013/045355 A1, also published as counterpart U.S. Publication No. 2014/0302665 A1, describes a method for producing nitride compound semiconductor devices on silicon substrates in which a layer structure is arranged between the silicon substrate and the functional layer sequence of the optoelectronic device, wherein a masking layer of a silicon nitride-containing material is embedded in the layer structure. By embedding the masking layer a reduction in dislocation density is achieved. However, embedding a layer of a material such as, for example, silicon nitride which does not belong to the material system of the other semiconductor layers is associated with increased manufacturing effort.

SUMMARY

Embodiments of the invention provide an improved method for producing a nitride compound semiconductor device on a substrate with a silicon surface, which method makes it possible to achieve particularly low defect densities in the semiconductor layer sequence and which is distinguished by comparatively low manufacturing effort.

According to at least one embodiment of the method, first of all a growth substrate with a silicon surface is provided. The growth substrate may in particular be a silicon substrate. The growth substrate may alternatively also be an SOI (Silicon On Insulator) substrate.

According to at least one embodiment, in the method a buffer layer, which comprises $Al_xIn_yGa_{1-x-y}N$ with $0 \leq x \leq 1$, $0 \leq y \leq 1$ and $x+y \leq 1$, is grown onto the silicon surface. The buffer layer preferably comprises $Al_xGa_{1-x}N$, with $0 \leq x \leq 1$.

In a further method step, the semiconductor layer sequence of the nitride compound semiconductor device is grown onto the buffer layer. The semiconductor layer sequence is based on a nitride compound semiconductor. "Based on a nitride compound semiconductor" means in the present context that the semiconductor layer sequence or at least one layer thereof comprises a III-nitride compound semiconductor material, preferably $Al_mIn_nGa_{1-m-n}N$, wherein $0 \leq m \leq 1$, $0 \leq n \leq 1$ and $m+n \leq 1$. This material does not absolutely have to exhibit a mathematically exact composition according to the above formula. Instead, it may comprise one or more dopants and additional constituents which do not substantially modify the characteristic physical properties of the $Al_mIn_nGa_{1-m-n}N$ material. For simplicity's sake, however, the above formula includes only the fundamental constituents of the crystal lattice (Al, In, Ga, N), even if these may in part be replaced by small quantities of further substances.

According to at least one configuration, the nitride compound semiconductor device is an optoelectronic device. The semiconductor layer sequence contains in particular an active layer of the optoelectronic device. In this configuration the semiconductor layer sequence is, for example, a light-emitting diode layer sequence. The active layer is in particular a layer which emits radiation when the device is in operation and which, for example, may take the form of a pn-junction, a double heterostructure, a single quantum well structure or a multiple quantum well structure. In addition to the active layer, the light-emitting diode layer sequence may, for example, comprise an n-type semiconductor region and a p-type semiconductor region, which surround the active layer.

In the method the buffer layer is grown with a material composition which varies in the growth direction. The buffer layer advantageously comprises a material composition which varies in such a way that a lateral lattice constant of the buffer layer increases stepwise or continuously in a first region and decreases stepwise or continuously in a second region, which follows the first region in the growth direction. The lateral lattice constant should here and hereinafter be understood to mean the lattice constant in the direction extending perpendicular to the growth direction. The buffer layer preferably consists solely of the first region and the second region, i.e., the buffer layer does not have any further regions apart from the first region and the second region following in the growth direction.

At an interface with the semiconductor layer sequence, the buffer layer has a smaller lateral lattice constant than a semiconductor layer, adjoining the buffer layer, of the semiconductor layer sequence.

It has been demonstrated that a buffer layer with a lattice constant varying in this way allows the achievement of a particularly low defect density in the semiconductor layer sequence. This is achieved in particular in that the lateral lattice constant of the buffer layer in the second region is reduced stepwise or continuously in such a way that it is smaller at the interface with the following semiconductor layer sequence than in the semiconductor layer, adjoining the buffer layer, of the semiconductor layer sequence. There is therefore a jump in the lattice constant at the interface between the buffer layer and the semiconductor layer sequence. This abrupt change in the lattice constant may result in defect reduction, since defects bend at the interface with the semiconductor layer sequence. In particular, defects in the buffer layer do not propagate significantly beyond the interface with the semiconductor layer sequence, but rather end in the region of the interface.

Because the buffer layer has a smaller lateral lattice constant than the adjacent semiconductor layer of the semiconductor layer sequence, the semiconductor layer sequence is grown displaying compressive strain. It is advantageously unnecessary to incorporate additional interlayers into the buffer layer to produce the compressive strain. The compressive strain produced in the semiconductor layer sequence has the advantage that it counteracts any tensile strain produced by the growth substrate during cooling of the layer system from growth temperature to room temperature.

The spatial variation of the lattice constant of the buffer layer in the growth direction proceeds in that the material composition is modified stepwise or continuously during growth. This is preferably achieved in that the aluminum content x of the material $Al_xIn_yGa_{1-x-y}N$ of the buffer layer decreases in the first region and increases again in the second region. Since the lattice constant reduces in this material system as the aluminum content increases, it is in this way ensured that the lattice constant increases in the first region and decreases in the second region. The buffer layer may in particular comprise $Al_xGa_{1-x}N$ with $0 \leq x \leq 1$, wherein the aluminum content x is varied in the growth direction.

At an interface with the growth substrate, the buffer layer advantageously has an aluminum content of $x \geq 0.8$, preferably $x \geq 0.9$. The aluminum content at the interface with the growth substrate may in particular even amount to $x=1$. In this case, the buffer layer comprises AlN at the interface with the growth substrate.

The buffer layer advantageously has a minimum aluminum content x, wherein at the minimum $x \leq 0.6$, preferably $x \leq 0.2$, particularly preferably $x \leq 0.1$. In other words, the aluminum content is reduced stepwise or continuously in the first region in such a way that it falls to a value of $x \leq 0.6$, preferably $x \leq 0.2$ or even $x \leq 0.1$, and in the following second region is increased again stepwise or continuously. The minimum aluminum content x is thus achieved at the boundary between the first region and the second region.

At an interface with the semiconductor layer sequence the buffer layer advantageously has an aluminum content of $x \geq 0.6$, preferably $x \geq 0.8$ or even $x \geq 0.9$.

The aluminum content at the interface with the semiconductor layer sequence may in particular be $x=1$. In this case, the buffer layer comprises AlN at the interface with the semiconductor layer sequence.

A semiconductor layer, adjoining the buffer layer, of the semiconductor layer sequence preferably comprises $Al_mIn_nGa_{1-m-n}N$, wherein $m \leq 0.5$. Preferably, $m \leq 0.2$ or even $m \leq 0.1$. The semiconductor layer, adjoining the buffer layer, of the semiconductor layer sequence thus advantageously has a significantly lower aluminum content than the buffer layer at the interface with the semiconductor layer sequence.

In one preferred configuration the silicon surface of the growth substrate is a (111) plane. The (111) plane of a silicon crystal is particularly well suited to growing a hexagonal nitride compound semiconductor material due to the quasi-hexagonal crystal structure.

In a preferred configuration of the method, the growth substrate is detached after growth of the semiconductor layer sequence. In this configuration the semiconductor layer sequence is advantageously joined to a carrier substrate at an opposite surface from the growth substrate. Since the carrier substrate does not have to be suitable for growing a nitride compound semiconductor material, it may advantageously be selected on the basis of other criteria, in particular good thermal and/or electrical conductivity. In the case of an optoelectronic nitride compound semiconductor device, before the semiconductor layer sequence is joined to the carrier substrate a mirror layer may be applied to the semiconductor layer sequence, to reflect radiation emitted in the direction of the carrier substrate during operation of the optoelectronic nitride compound semiconductor device to a radiation exit face opposite the carrier substrate.

Once the growth substrate has been detached, the buffer layer may be removed at least in part, for example, using an etching method. A residue of the buffer layer remaining in the optoelectronic device is in this case arranged on the radiation exit side of the optoelectronic device.

BRIEF DESCRIPTION OF THE DRAWINGS

The invention is explained in greater detail below with reference to exemplary embodiments in conjunction with FIGS. 1 to 4, in which.

In the figures identical or identically acting components are in each case provided with the same reference numerals. The components illustrated and the size ratios of the components to one another should not be regarded as to scale.

DETAILED DESCRIPTION OF ILLUSTRATIVE EMBODIMENTS

Figure 1:
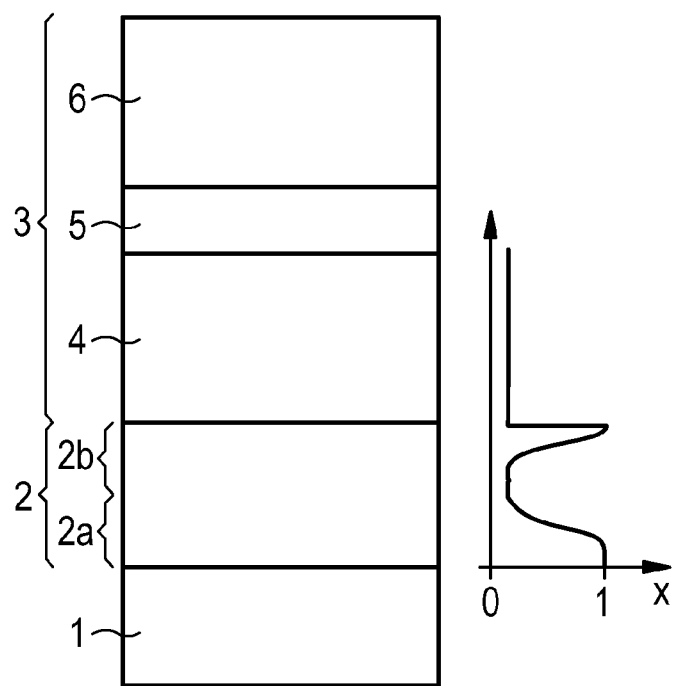
FIG. 1 shows a layer sequence applied to a silicon substrate in one exemplary embodiment of the method for producing a nitride compound semiconductor device.

In the method, as shown in FIG. 1, a growth substrate 1 is provided which comprises a silicon surface. The growth substrate 1 may, for example, be a silicon wafer. It is however alternatively also possible for the growth substrate 1 to be an SOI substrate. The silicon surface of the growth substrate 1 is preferably a (111) crystal plane, which is particularly well suited to the growth of nitride compound semiconductors due to its hexagonal symmetry. Compared with substrates of sapphire, GaN or SiC used generally to grow nitride compound semiconductor materials, the growth substrate 1 with the silicon surface has the advantage of being comparatively inexpensive.

In the method, firstly a buffer layer 2 of $Al_xIn_yGa_{1-x-y}N$ with $0 \leq x \leq 1$, $0 \leq y \leq 1$ and $x+y \leq 1$ is grown onto the silicon surface of the growth substrate 1. In the exemplary embodiment the indium content y=0, i.e., the buffer layer comprises $Al_xGa_{1-x}N$ with $0 \leq x \leq 1$. In the exemplary embodiment shown, the material composition of the buffer layer 2 has been varied during growth such that the lateral lattice constant of the buffer layer 2 increases continuously in a first region 2a and decreases continuously in a second region 2b following in the growth direction.

This is achieved in that the aluminum content x of the nitride compound semiconductor material of the buffer layer 2 is varied during growth. The profile of the aluminum content x in the buffer layer 2 and an adjacent semiconductor layer 4 of the semiconductor layer sequence 3 grown onto the buffer layer 2, the sequence being a light-emitting diode layer sequence in the exemplary embodiment, is shown schematically in FIG. 1.

The aluminum content x of the buffer layer 2 amounts at the interface between the growth substrate 1 and the buffer layer 2 advantageously to $x \geq 0.8$, preferably $x \geq 0.9$, in particular x=1, as in the exemplary embodiment shown.

Starting from the growth substrate 1, the aluminum content x firstly decreases continuously in the first region 2a. As a consequence, the lateral lattice constant of the nitride compound semiconductor material increases continuously. Between the first region 2a and the second region 2b the aluminum content x reaches a minimum, and accordingly the lattice constant of the nitride compound semiconductor material reaches a maximum. Between the first region 2a and the second region 2b the aluminum content x is advantageously at a minimum, at which $x \leq 0.6$, preferably $x \leq 0.2$ or even $x \leq 0.1$.

In the second region 2b of the buffer layer 2, which follows the first region 2a in the growth direction, the aluminum content x of the buffer layer 2 again increases continuously. At the interface between the buffer layer 2 and the adjacent semiconductor layer 4 of the light-emitting diode layer sequence 3, the aluminum content x reaches a value of advantageously $x \geq 0.6$, preferably $x \geq 0.8$ or even x=1, as in the exemplary embodiment shown.

In a next method step a semiconductor layer sequence 3 is grown onto the previously grown buffer layer 2. In the exemplary embodiment, the semiconductor layer sequence 3 is the light-emitting diode layer sequence of an optoelectronic device. The light-emitting diode layer sequence 3 is based on a nitride compound semiconductor.

The light-emitting diode layer sequence 3 in particular contains an active layer 5, which is suitable for emitting radiation. The active layer 5 may, for example, take the form of a pn-junction, of a double heterostructure, of a single quantum well structure or of a multiple quantum well structure. The term "quantum well structure" here includes any structure in which charge carriers undergo quantization of their energy states by inclusion ("confinement"). In particular, the term quantum well structure does not provide any indication of the dimensionality of the quantization. It thus encompasses inter alia quantum troughs, quantum wires and quantum dots and any combination of these structures.

Furthermore, the light-emitting diode layer sequence 3 contains at least one semiconductor layer 4 of a first conduction type and at least one semiconductor layer 6 of a second conduction type, wherein the at least one semiconductor layer 4 is, for example, n-doped and the at least one semiconductor layer 6 is, for example, p-doped.

The aluminum content of the buffer layer 2 is preferably increased continuously in the second region 2b such that the aluminum content at the interface with the light-emitting diode layer sequence 3 is greater than the aluminum content of the semiconductor layer 4 of the light-emitting diode layer sequence 3 which adjoins the buffer layer 2. The semiconductor layer 4 adjoining the light-emitting diode layer sequence 3 advantageously comprises $Al_mIn_nGa_{1-m-n}N$, wherein $m \leq 0.5$. In particular, m may be $\leq 0.2$ or even $\leq 0.1$. Because the aluminum content of the semiconductor layer 4 adjoining the buffer layer 2 is smaller than the aluminum content of the buffer layer 2 at the interface with the light-emitting diode layer sequence 3, the semiconductor layer 4 adjoining the buffer layer 2 is grown with compressive strain. This has the advantage of counteracting any tensile strain which may arise on cooling of the layer system from growth temperature to room temperature.

Figure 2:
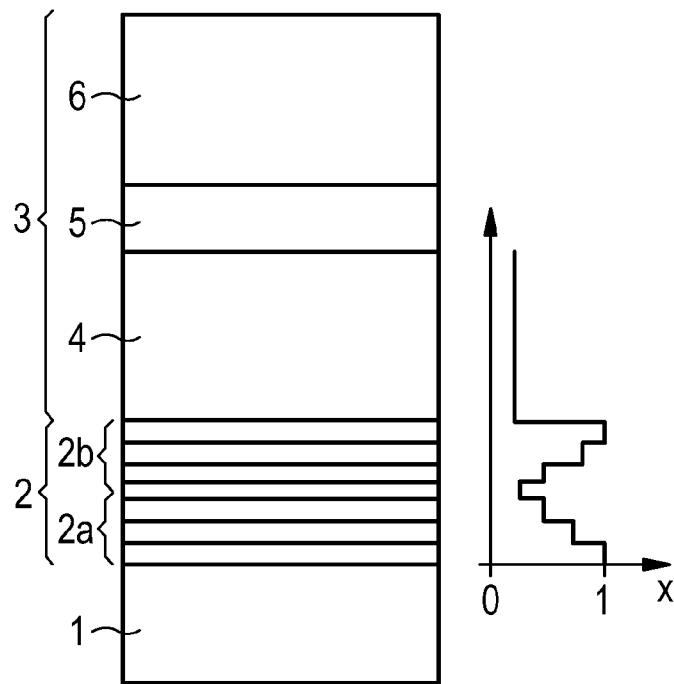
FIG. 2 shows a layer sequence applied to a silicon substrate in a further exemplary embodiment of the method for producing a nitride compound semiconductor device.

FIG. 2 shows a layer sequence in a further exemplary embodiment of the method for producing a nitride compound semiconductor device. The layer sequence differs from the exemplary embodiment of FIG. 1 in that the aluminum content x in the buffer layer 2 does not vary continuously but rather stepwise. In a first region 2a facing the growth substrate 1 the aluminum content x in the buffer layer 2 decreases stepwise, and in a second region 2b facing the light-emitting diode layer sequence 3 it increases again stepwise. In other words, the buffer layer 2 comprises a plurality of sublayers in the first region 2a, wherein the aluminum content x decreases stepwise from sublayer to sublayer. Furthermore, the buffer layer comprises a plurality of sublayers in the second region 2b, wherein the aluminum content x increases stepwise from sublayer to sublayer.

With regard to advantages and further advantageous configurations, the second exemplary embodiment corresponds to the above-described first exemplary embodiment.

Figure 3:
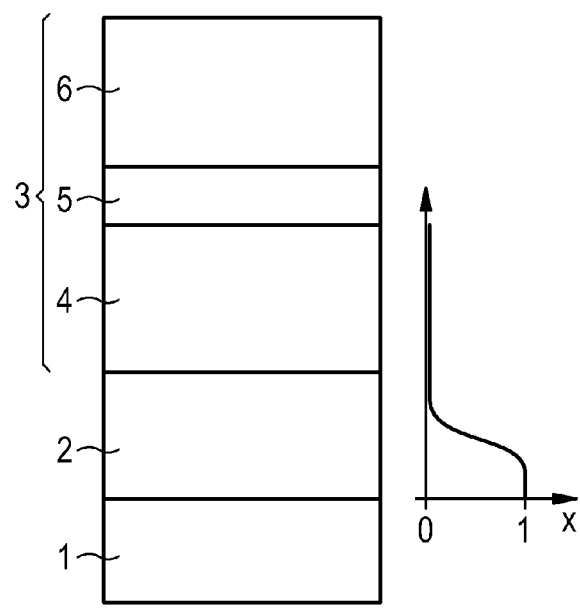
FIG. 3 shows a layer sequence applied to a silicon substrate in a comparative example not according to the invention.

For the purposes of comparison, FIG. 3 shows a layer sequence on a growth substrate 1 of silicon in a comparative example not according to the invention for producing an optoelectronic nitride compound semiconductor device. In this comparative example the aluminum content x of the buffer layer 2 reduces continuously in conventional manner from the growth substrate 1 in the growth direction, in order to adapt the aluminum content to the aluminum content of the semiconductor layer 4, adjoining the buffer layer 2, of the light-emitting diode layer sequence 3. In this procedure the buffer layer 2 has substantially the same lattice constant at the interface with the light-emitting diode layer sequence 3 as the semiconductor layer 4, adjoining the buffer layer 2, of the light-emitting diode layer sequence 3. In contrast to the above-described exemplary embodiments of FIG. 1 and FIG. 2, there is therefore no abrupt change in the lattice constant of the nitride compound semiconductor material at the interface between the buffer layer 2 and the light-emitting diode layer sequence 3.

Figure 4:
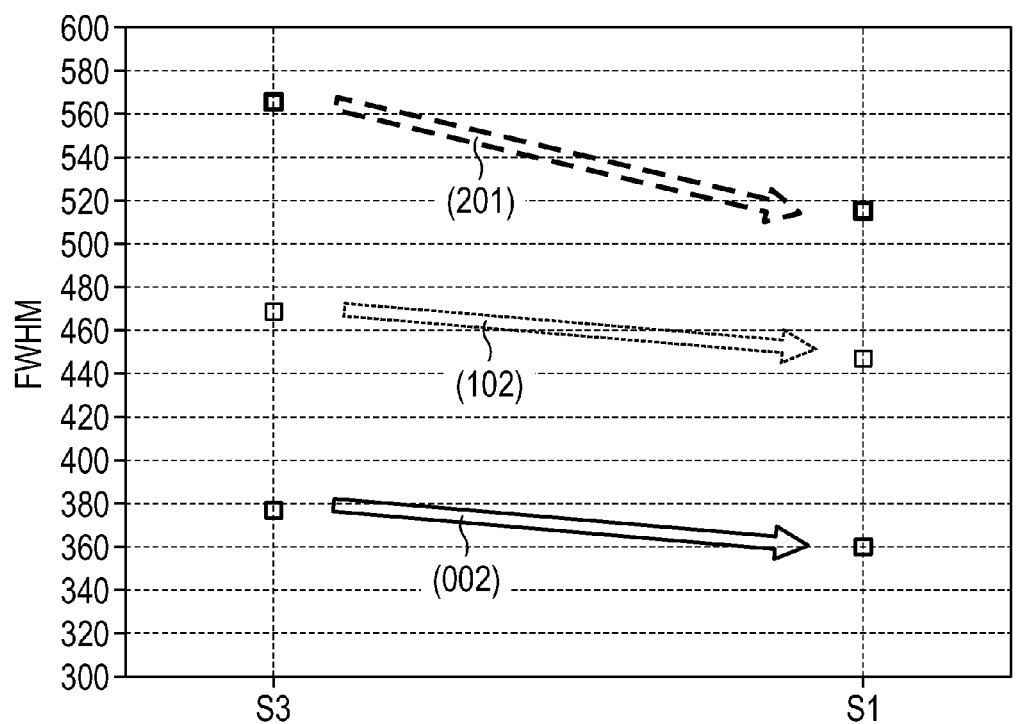
FIG. 4 is a graph of measured half-value widths of X-ray diffraction reflections of the layer sequence according to the exemplary embodiment of FIG. 1 compared with the layer sequence in the comparative example of FIG. 3.

FIG. 4 shows the full half-value width (FWHM—Full Width at Half Maximum) of the X-ray diffraction reflections of the crystal planes (002), (102) and (201) for the layer sequence of the exemplary embodiment of FIG. 1 (S1) and the layer sequence of the comparative example of FIG. 3 (S3). The comparison shows that the full half-value width of the measured X-ray diffraction reflections for the layer sequence S1 produced according to the method described herein is less than for the layer sequence S3, which has been produced in accordance with the comparative example not according to the invention. The smaller half-value widths of the reflections in the case of examination using X-ray diffraction point to a reduced defect density of the layer sequence in the exemplary embodiment according to the invention.

Transmission electron micrographs (not shown) of the layer sequence produced using the method according to the invention revealed that dislocations in particular bend due to the jump in the lateral lattice constant at the interface between the buffer layer and the semiconductor layer sequence. There is furthermore a reduction in dislocations at the interface between the buffer layer and the semiconductor layer sequence applied thereto due to annihilation.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing an optoelectronic device, the method comprising:
   providing a growth substrate with a silicon surface;
   growing a buffer layer onto the silicon surface in a growth direction, the buffer layer comprising $Al_xIn_yGa_{1-x-y}N$ with $0\leq x\leq 1$, $0\leq y\leq 1$ and $x+y\leq 1$, wherein the buffer layer comprises a material composition that varies in such a way that a lateral lattice constant of the buffer layer increases stepwise or continuously in a first region and decreases stepwise or continuously in a second region that follows the first region in the growth direction; and
   growing a semiconductor layer sequence that includes an active layer onto the buffer layer, wherein, at an interface with the semiconductor layer sequence, the buffer layer has a smaller lateral lattice constant than a semiconductor layer of the semiconductor layer sequence that adjoins the buffer layer,
   wherein semiconductor layer sequence is a light emitting diode layer sequence.

2. The method according to claim 1, wherein the buffer layer comprises $Al_xGa_{1-x}N$ with $0\leq x\leq 1$.

3. The method according to claim 1, wherein, starting from the growth substrate, an aluminum content of the buffer layer decreases in the first region and increases in the second region, and where x represents the aluminum content.

4. The method according to claim 1, wherein, at the interface with the growth substrate, the buffer layer has an aluminum content of $x\leq 0.8$.

5. The method according to claim 1, wherein, at the interface with the growth substrate, the buffer layer has an aluminum content of $x\geq 0.9$.

6. The method according to claim 1, wherein the buffer layer has a minimum aluminum content of $x\leq 0.6$.

7. The method according to claim 1, wherein the buffer layer has a minimum aluminum content of $x\leq 0.2$.

8. The method according to claim 1, wherein the buffer layer has an aluminum content of $x\geq 0.6$ at the interface with the semiconductor layer sequence.

9. The method according to claim 1, wherein the buffer layer has an aluminum content of $x\geq 0.8$ at the interface with the semiconductor layer sequence.

10. The method according to claim 1, wherein the semiconductor layer that adjoins the buffer layer comprises $Al_mIn_nGa_{1-m-n}N$, and wherein $m\leq 0.5$.

11. The method according to claim 1, wherein the semiconductor layer that adjoins the buffer layer comprises $Al_mIn_nGa_{1-m-n}N$, and wherein $m\leq 0.2$.

12. The method according to claim 1, wherein the silicon surface is a plane.

13. The method according to claim 1, further comprising detaching the growth substrate after growing the semiconductor layer sequence.

14. The method according to claim 13, wherein the buffer layer is at least partly removed after the growth substrate has been detached.

15. The method according to claim 1, further comprising joining the semiconductor layer sequence to a carrier substrate on an opposite side from the growth substrate.

16. A method for producing an optoelectronic device, the method comprising:
   providing a growth substrate with a silicon surface;
   growing a buffer layer onto the silicon surface in a growth direction, the buffer layer comprising $Al_xIn_yGa_{1-x-y}N$ with $0\leq x\leq 1$, $0\leq y\leq 1$ and $x+y\leq 1$, wherein the buffer layer comprises a material composition that varies in such a way that a lateral lattice constant of the buffer layer increases stepwise or continuously in a first region and decreases stepwise or continuously in a second region that follows the first region in the growth direction;
   growing a semiconductor layer sequence that includes an active layer onto the buffer layer, wherein, at an interface with the semiconductor layer sequence, the buffer layer has a smaller lateral lattice constant than a semiconductor layer of the semiconductor layer sequence that adjoins the buffer layer;
   detaching the growth substrate after growing the semiconductor layer sequence; and
   at least partially, removing the buffer layer after the growth substrate has been detached,
   wherein semiconductor layer sequence is a light emitting diode layer sequence.

* * * * *

UNITED STATES PATENT AND TRADEMARK OFFICE
CERTIFICATE OF CORRECTION

PATENT NO. : 9,660,137 B2  
APPLICATION NO. : 14/891924  
DATED : May 23, 2017  
INVENTOR(S) : Bergbauer Page 1 of 1

It is certified that error appears in the above-identified patent and that said Letters Patent is hereby corrected as shown below:

In the Claims

In Column 7, Lines 21-22, Claim 1, delete "the buffer layer comprising $Al_xIn_yGa_{1-x-y}N$ with $0 \leq 1$, $0 \leq y \leq 1$ and $x + y \leq 1$," and insert --the buffer layer comprising $Al_xIn_yGa_{1-x-y}N$ with $0 \leq x \leq 1$, $0 \leq y \leq 1$ and $x + y \leq 1$,--.

In Column 7, Line 44, Claim 4, delete "$x \leq 0.8$" and insert --$x \geq 0.8$--.

Signed and Sealed this  
Seventeenth Day of October, 2017

Joseph Matal  
*Performing the Functions and Duties of the*  
*Under Secretary of Commerce for Intellectual Property and*  
*Director of the United States Patent and Trademark Office*